(12) United States Patent
Yoshizawa (10) Patent No.: US 8,951,821 B2
(45) Date of Patent: Feb. 10, 2015

(54) METHOD FOR PRODUCING OSCILLATOR

(71) Applicant: Seiko Epson Corporation, Tokyo (JP)

(72) Inventor: Takahiko Yoshizawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/093,290

(22) Filed: Nov. 29, 2013

(65) Prior Publication Data

US 2014/0162391 A1 Jun. 12, 2014

(30) Foreign Application Priority Data

Dec. 7, 2012 (JP) ................... 2012-267814

(51) Int. Cl.
 *H01L 21/00* (2006.01)
 *B81C 1/00* (2006.01)
(52) U.S. Cl.
 CPC ................... *B81C 1/00158* (2013.01)
 USPC .......................................................... 438/52
(58) Field of Classification Search
 None
 See application file for complete search history.

(56) References Cited

U.S. PATENT DOCUMENTS

| 7,129,806 | B2 | 10/2006 | Sato |
| 7,656,252 | B2 | 2/2010 | Inaba et al. |
| 8,018,302 | B2 | 9/2011 | Inaba et al. |
| 8,063,721 | B2 | 11/2011 | Inaba et al. |
| 8,198,957 | B2 | 6/2012 | Inaba et al. |
| 2009/0244206 | A1 | 10/2009 | Nakayama |
| 2012/0146176 | A1* | 6/2012 | Sagae et al. ................... 257/506 |

FOREIGN PATENT DOCUMENTS

| JP | A-2005-45694 | 2/2005 |
| JP | A-2005-215624 | 8/2005 |
| JP | A-2005-236518 | 9/2005 |
| JP | A-2006-138997 | 6/2006 |
| JP | A-2007-160495 | 6/2007 |
| JP | A-2009-31197 | 2/2009 |
| JP | A-2009-252757 | 10/2009 |

* cited by examiner

*Primary Examiner* — Calvin Choi
(74) *Attorney, Agent, or Firm* — Oliff PLC (57) ABSTRACT

A method for producing an oscillator includes: (a) forming a first layer on a substrate; (b) ion implanting a first impurity into a first region of the first layer; (c) forming a first electrode having a tapered plane on a side surface thereof by patterning the first layer; (d) forming a sacrificial layer on the first electrode and on the tapered plane of the first electrode; (e) forming a second electrode on the substrate and the sacrificial layer; and (f) removing the sacrificial layer. The step (b) is performed so that the concentration of the first impurity monotonically decreases from the upper surface side to the lower surface side in a region located at a depth of more than 10 nm from the upper surface of the first electrode.

7 Claims, 6 Drawing Sheets

METHOD FOR PRODUCING OSCILLATOR

The entire disclosure of Japanese Patent Application No. 2012-267814, filed Dec. 7, 2012 is expressly incorporated by reference herein.

BACKGROUND

1. Technical Field

The present invention relates to a method for producing an oscillator.

2. Related Art

There has been an increase in the development of technologies related to MEMS (Micro-Electro-Mechanical System) in the field of acceleration sensors and video devices. MEMS refers to a very small functional device produced using a semiconductor production technique, and is produced on the basis of a microprocessing technique in the semiconductor production of the related art. Examples of the functional device to be produced include microoscillators, microsensors, and microactuators, and the functional device exhibits a variety of functions by oscillation, deformation, or other action of a microstructure (see, for example, JP-A-2007-160495).

In the case of a functional device which detects a variety of physical amounts by oscillating or deforming a microstructure, the structure may be essentially damaged due to the oscillation or deformation. In particular, to a bend region or a flexure region of an oscillator or the like, stress is repeatedly applied, and therefore, it is desirable to design the structure so that such stress does not concentrate on a specific region as much as possible. Further, for example, in the case where a groove, a hole, a defect, or the like is formed in the structure, stress concentration due to bend or flexure is liable to occur particularly prominently in the region where a groove, a hole, a defect, or the like is formed.

In the case where such an oscillator or the like is formed by a microprocessing technique of the related art in the semiconductor production, the shape after processing may be sometimes problematic, although it is not problematic in the semiconductor production. For example, in the case where an electrode is formed on a substrate, when it is formed by a microprocessing technique of the related art, a small angular portion is sometimes formed in the vicinity of an edge of the electrode. Such an angular portion is not a big problem in a semiconductor device having no bend region or flexure region. However, in the case where an oscillator or the like having a fixed electrode and a movable electrode disposed to face the fixed electrode is produced, for example, if a small angular portion is formed on the fixed electrode, an inappropriate groove derived from the angular portion of the fixed electrode is sometimes formed on the movable electrode to be formed after forming the fixed electrode. In this case, stress concentration is liable to occur in the groove of the movable electrode corresponding to the bend region or the flexure region of the oscillator, and the reliability of the oscillator may be deteriorated. Further, a short circuit may occur due to the contact between the angular portion of the fixed electrode and the movable electrode.

SUMMARY

An advantage of some aspects of the invention is to provide a method for producing an oscillator in which a region on which stress concentrates is reduced so as to achieve high reliability, and the occurrence of short circuit between electrodes is suppressed.

The invention can be implemented as the following forms or application examples.

APPLICATION EXAMPLE 1

This application example is directed to a method for producing an oscillator including: (a) forming a first layer on a substrate; (b) ion implanting a first impurity into a first region of the first layer; (c) forming a first electrode having a tapered plane on a side surface thereof by patterning the first layer; (d) forming a sacrificial layer on the first electrode and on the tapered plane of the first electrode; (e) forming a second electrode on the substrate and the sacrificial layer so that the second electrode is disposed to face at least a part of the upper surface of the first electrode and the tapered plane of the first electrode; and (f) removing the sacrificial layer, wherein the step (b) is performed so that the concentration of the first impurity monotonically decreases from the upper surface side to the lower surface side in a region located at a depth of more than 10 nm from the upper surface of the first electrode.

According to the method for producing an oscillator of this application example, a highly reliable oscillator, in which an angular portion is hardly formed on the first electrode, a groove acting as an unexpected stress concentration point is hardly formed on a surface of the second electrode facing the first electrode, the damage to the second electrode which is deformed by an electrostatic force between the first electrode and the second electrode is suppressed, and the occurrence of short circuit between the electrodes is suppressed can be produced.

APPLICATION EXAMPLE 2

Application Example 1 may be configured such that the method further includes (g) ion implanting a second impurity into a second region of the first layer between the step (a) and the step (b), or between the step (b) and the step (c), and the step (g) is performed so that the second region is located closer to the substrate than the first region, at least a part of the second region overlaps with the first region, and the combined concentration of the first impurity and the second impurity monotonically decreases from the upper surface side to the lower surface side in a region located at a depth of more than 10 nm from the upper surface of the first electrode.

According to the method for producing an oscillator of this application example, an oscillator in which the damage to the electrode and the occurrence of short circuit between the electrodes are suppressed can be produced, and further, the control of the resistance of the first electrode can be easily performed.

APPLICATION EXAMPLE 3

Application Example 1 or 2 may be configured such that the method furthers include, between the step (a) and the step (b), or between the step (b) and the step (c): (g) ion implanting a second impurity into a second region of the first layer; and (h) heating the first layer, and the step (g) is performed so that the second region is located closer to the substrate than the first region, the step (h) is performed so that at least a part of the second impurity is diffused in the first region, and the step (g) and the step (h) is performed so that the combined concentration of the first impurity and the second impurity monotonically decreases from the upper surface side to the lower surface side in a region located at a depth of more than 10 nm from the upper surface of the first electrode.

According to the method for producing an oscillator of this application example, an oscillator in which the damage to the electrode and the occurrence of short circuit between the electrodes are suppressed can be produced, and further, the control of the resistance of the first electrode and the activation of the impurity can be easily performed.

APPLICATION EXAMPLE 4

Any of Application Examples 1 to 3 may be configured such that the first impurity and the second impurity have the same conductivity type.

APPLICATION EXAMPLE 5

Any of Application Examples 1 to 4 may be configured such that the first layer is composed of a semiconductor layer, and in the step of forming the sacrificial layer, the semiconductor layer is formed by thermal oxidation.

According to the method for producing an oscillator of this application example, an oscillator in which the damage to the electrode and the occurrence of short circuit between the electrodes are suppressed can be produced, and further, since the distance between the first electrode and the second electrode can be made constant, and therefore, an oscillator in which the occurrence of short circuit between the electrodes is further suppressed can be produced.

APPLICATION EXAMPLE 6

Application Example 5 may be configured such that the first layer is composed of a polycrystalline silicon layer.

APPLICATION EXAMPLE 7

Any of Application Examples 1 to 6 may be configured such that the step of patterning the first layer includes: forming a resist pattern on the first layer; and etching the first layer by using the resist pattern as a mask, and in the etching step, etching is allowed to proceed on the lower surface side of the resist pattern.

According to the method for producing an oscillator of this application example, an oscillator in which the controllability of the tapered shape is favorable and further, damage hardly occurs can be produced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, several embodiments of the invention will be described. The embodiments described below are mere examples of the invention. The invention is by no means limited to the embodiments described below and encompasses various modifications carried out within the scope in which the gist of the invention is not changed. Incidentally, not all structures described below are necessarily essential components of the invention.

1. Oscillator

Figure 1:
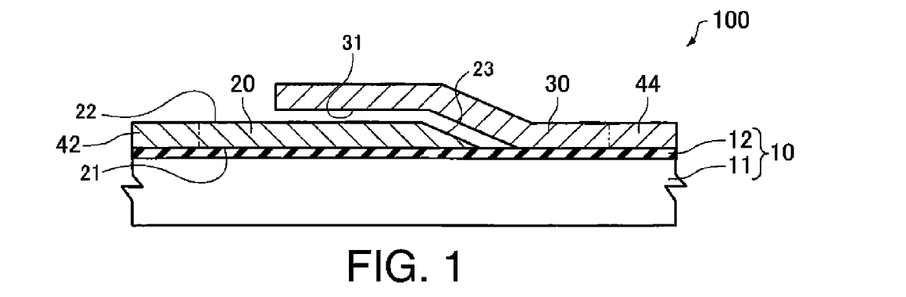
FIG. 1 is a schematic cross-sectional view showing an oscillator according to an embodiment.
Figure 2:
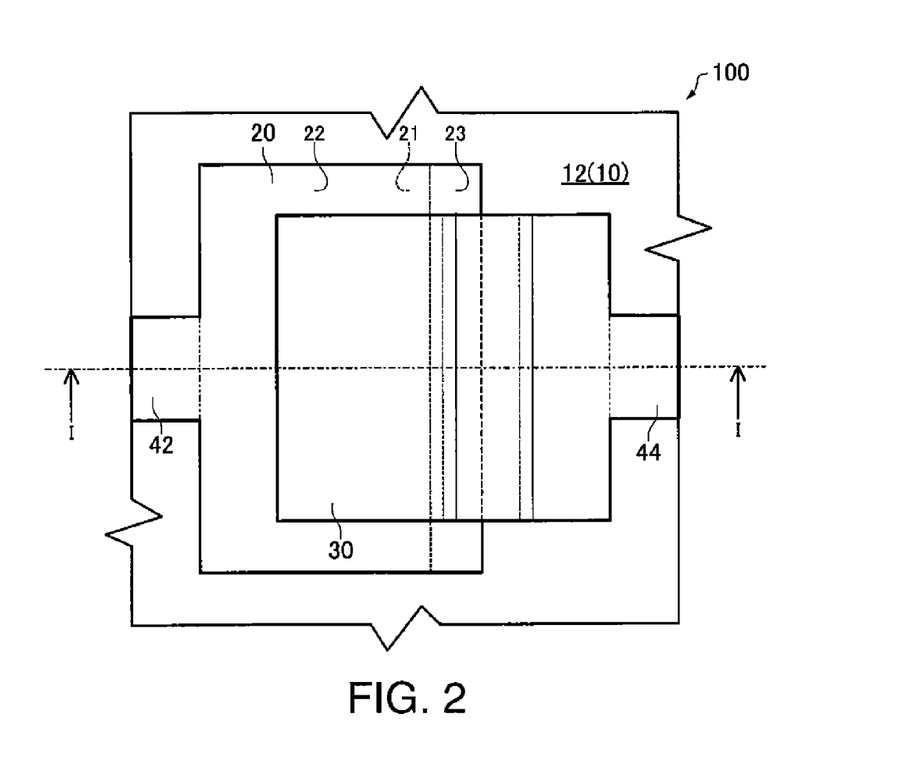
FIG. 2 is a schematic plan view showing the oscillator according to the embodiment.

An oscillator 100 of this embodiment includes a substrate 10, a first electrode 20, which is formed on the substrate 10 and is composed of polycrystalline silicon doped with an impurity, and a second electrode 30, which is disposed above and spaced apart from the first electrode 20, and is deformed by an electrostatic force between the first electrode 20 and the second electrode 30. The impurity concentration in the first electrode 20 monotonically decreases from the upper surface side to the lower surface side in a region located at a depth of more than 10 nm from the upper surface of the first electrode 20.

FIG. 1 is a schematic cross-sectional view showing the oscillator 100 of this embodiment. FIG. 2 is a schematic plan view showing the oscillator 100 of this embodiment. The cross section cut along the I-I line in FIG. 2 corresponds to FIG. 1.

1.1 Substrate

As the substrate 10, a single crystalline semiconductor substrate, for example, a substrate made of silicon (Si), gallium arsenide (GaAs), or the like can be used. Further, as the substrate 10, any of a variety of substrates such as a ceramic substrate, a glass substrate, a sapphire substrate, and a synthetic resin substrate may be used. The substrate 10 is preferably a single crystalline silicon substrate. The thickness of the substrate 10 is, for example, from 100 to 400 μm.

The substrate 10 may have an insulating underlayer 12 as shown in the drawing. In the example shown in the drawing, the substrate 10 is configured such that an underlayer 12 is formed on the surface of a silicon substrate 11. Examples of the material of the underlayer 12 include silicon nitride ($Si_3N_4$). Further, the underlayer 12 may be used as an etching stopper layer in the case where a hollow for accommodating the oscillator 100 is formed. In addition, in the substrate 10, a trench insulating layer, an LOCOS (Local Oxidation of Silicon) insulating layer, a semi-recess LOCOS insulating layer, or the like (not shown in the drawing) may be further formed under the underlayer 12.

1.2 First Electrode

The first electrode 20 is formed on the substrate 10. The shape of the first electrode 20 is not particularly limited, and is suitably designed according to the requirement for the function or sensitivity of the oscillator 100. In the example shown in FIG. 2, the first electrode 20 is formed in a rectangular shape in plan view and electrically connected to an integrally formed wiring 42.

The first electrode 20 has a first plane 21 and a second plane 22, both of which are in parallel with the substrate 10 and define the thickness of the first electrode 20. The first plane 21 is a flat plane facing the substrate 10, in other words, a lower surface of the first electrode 20, and the second plane 22 is a flat plane located on the opposite side to the substrate 10, in other words, an upper surface of the first electrode 20. The outline of the first plane 21 in plan view is located outside the outline of the second plane 22 in plan view in at least a region where the first electrode 20 faces the second electrode 30.

The first electrode 20 has a tapered plane 23 connecting between the first plane 21 and the second plane 22. The tapered plane 23 is a plane which defines the thickness of the first electrode 20 so that the thickness thereof decreases toward the substrate 10 in at least a region where the first electrode 20 faces the second electrode 30. The tapered plane 23 is drawn as a flat plane in the drawing, but may be a flat plane or a curved plane, and also may be a combination of these planes. The tapered plane 23 may be a continuous plane over the entire periphery of the first electrode 20 in plan view.

Here, for each of the first plane 21, the second plane 22, and the tapered plane 23, the expression of "flat plane" is used, however, this expression does not mean that the first plane 21, the second plane 22, or the tapered plane 23 is smooth and does not have even slight irregularities. For example, the first plane 21, the second plane 22, or the tapered plane 23 sometimes has irregularities derived from an atom constituting the first electrode 20, irregularities derived from a secondary structure (such as a particle, a particle aggregate, or a particle boundary) of a substance constituting the first electrode 20, or the like, and therefore is not an exact flat plane from a microscopic viewpoint in some cases. However, there is a condition in which even in such cases, such irregularities become less noticeable from a more macroscopic viewpoint, and therefore are observed to such an extent that the first plane 21, the second plane 22, or the tapered plane 23 is allowed to be referred to as a flat plane. Accordingly, in this specification, if a plane can be recognized as a flat plane from such a more macroscopic viewpoint, this plane shall be referred to as a flat plane. More specifically, for example, when the cross section of the first plane 21, the second plane 22, or the tapered plane 23 is observed by a general-purpose scanning electron microscope having a resolution of about 5 nm, if noticeable irregularities are not observed, the plane shall be referred to as a flat plane.

A distance between the first plane 21 and the second plane 22 of the first electrode 20 (a thickness defined by the first plane 21 and the second plane 22) can be set to 100 nm or more and 10 μm or less. The thickness of a portion defined by the first plane 21 and the tapered plane 23 of the first electrode 20 may be gradually decreased along the direction toward the second electrode 30.

The function of the first electrode 20 in the oscillator 100 of this embodiment is to serve as one of the electrodes constituting a capacitor by being paired with the second electrode 30.

In this embodiment, the first electrode 20 is composed of polycrystalline silicon doped with an impurity. The first electrode may be composed of a semiconductor material such as amorphous silicon or single crystalline silicon. Examples of the impurity include arsenic (As), phosphorus (P), and boron (B). The impurity can be introduced by, for example, ion implantation. The impurity may be activated by a heat treatment.

The impurity concentration in the first electrode 20 monotonically decreases from the upper surface (the second plane 22) side to the lower surface (the first plane 21) side in a region located at a depth of more than 10 nm from the upper surface (the second plane 22) of the first electrode 20. The impurity concentration can be changed in the thickness direction of the first electrode 20 by the condition such as energy when performing ion implantation.

Here, the impurity concentration can be estimated from the condition when performing ion implantation or the condition for annealing, and also can be measured by a secondary ion mass spectrometry (SIMS) or the like. The SIMS can perform measurement under the condition that, for example, the first electrode 20 is irradiated with 5 keV Cs as a primary ion from the side of the second plane 22. By doing this, a concentration profile from the upper surface side to the lower surface side of the first electrode 20 can be obtained.

The phrase "the impurity concentration monotonically decreases" refers to that in the impurity concentration profile from the upper surface side to the lower surface side, the concentration decreases with no local maximum points or local minimum points. Incidentally, the maximum or the minimum of the concentration appearing in the profile due to the noise or the resolution when performing measurement by SIMS or the like shall be ignored.

The impurity concentration in the first electrode 20 monotonically decreases from the upper surface side to the lower surface side in a region located at a depth of more than 10 nm from the upper surface of the first electrode 20 as described above, however, in a region located at a depth of less than 10 nm from the upper surface of the first electrode 20, the concentration profile may have a maximum or a local maximum.

The first electrode 20 is formed by, for example, depositing a polycrystalline silicon layer on the entire surface of the substrate 10 by a CVD (Chemical Vapor Deposition) method, a sputtering method, or the like, and thereafter patterning the layer by a photolithographic technique and an etching technique. Examples of the etching technique at this time include wet etching and dry etching. When dry etching is used, an effect of suppressing the formation of an angular portion on the first electrode 20 is prominent. The angular portion will be described in detail in "3. Experimental Examples".

In this embodiment, the etching rate is set higher in a region where the impurity concentration is higher, and the etching rate is set lower in a region where the impurity concentration is lower. That is, the impurity concentration is set higher and the etching rate is set higher on the upper surface side than on the lower surface side. According to this, the tapered shape is efficiently formed. The etching is preferably isotropic etching. One of the reasons is that a difference in lateral etching rate due to a difference in impurity concentration becomes prominent, and therefore, the tapered shape can be more efficiently formed. Further, in order to increase the etching rate, an impurity having n-type conductivity may be used.

1.2 Second Electrode

The second electrode 30 is disposed above and spaced apart from the first electrode 20. Further, the second electrode 30 can be deformed by an electrostatic force between the first electrode 20 and the second electrode 30.

The second electrode 30 may have a portion formed on the substrate 10. The shape of the second electrode 30 is not particularly limited, and is suitably designed according to the requirement for the function or sensitivity of the oscillator 100. In the example shown in FIG. 2, the second electrode 30 is formed in a rectangular shape so as to overlap with the first electrode 20 in plan view and electrically connected to an integrally formed wiring 44.

The second electrode 30 has a facing plane 31 facing and spaced apart from the first electrode 20. The facing plane 31 faces and is spaced apart from the second plane 22 and the tapered plane 23 of the first electrode 20.

The thickness of the second electrode 30 can be set to, for example, 100 nm or more and 10 μm or less. The function of the second electrode 30 in the oscillator 100 is to serve as one of the electrodes constituting a capacitor by being paired with the first electrode 20.

The material of the second electrode 30 is not particularly limited as long as it has electrical conductivity, however, for example, one metal or an alloy of two or more metals selected from the group consisting of Cu, Au, Pt, Co, and Ni, or polycrystalline silicon doped with an impurity can be used. In the case of polycrystalline silicon, examples of the impurity include arsenic (As), phosphorus (P), and boron (B). The impurity can be introduced by, for example, ion implantation. The impurity may be activated by a heat treatment.

The second electrode 30 can be formed by, for example, forming a sacrificial layer on the first electrode 20, depositing a layer made of a desired material on the sacrificial layer using a CVD method, a sputtering method, or the like, and thereafter patterning the layer using a photolithographic technique and an etching technique, followed by removing the sacrificial layer by etching. As such a sacrificial layer, oxide silicon or the like can be used, and in this case, the sacrificial layer may be formed by thermally oxidizing the polycrystalline silicon of the first electrode 20. In the case where the sacrificial layer is formed by thermally oxidizing the polycrystalline silicon, the shape of the second plane 22 and the tapered plane 23 of the first electrode 20 is easily transferred to the facing plane 31 of the second electrode 30 with high followability, and therefore, an effect of this embodiment that the formation of a groove in the facing plane 31 of the second electrode 30 is suppressed is more prominent.

1.3. Operational Effect

In the oscillator 100 of this embodiment, grooves acting as stress concentration points are reduced on the surface of the second electrode 30 facing the first electrode 20. That is, since the impurity concentration in the first electrode 20 monotonically decreases from the surface side to the depth direction in a region located at a depth of more than 10 nm from the surface of the first electrode 20, when the first electrode 20 is formed, an angular portion is hardly formed on the first electrode 20. Therefore, the shape of a groove corresponding to the angular portion on the first electrode 20 is hardly formed on the second electrode 30 formed to face the first electrode 20. According to this, in the oscillator 100 of this embodiment, in the case where the second electrode 30 is deformed by an electrostatic force between the first electrode 20 and the second electrode 30, stress concentration points on the second electrode 30 are reduced, and as a result, the second electrode 30 is hardly damaged, and thus, high reliability is provided. Further, the shape of a groove corresponding to an angular portion on the first electrode 20 is hardly formed on the second electrode 30 formed to face the first electrode 20, and therefore, the first electrode 20 and the second electrode 30 hardly come into contact with each other, and thus, an effect of suppressing the occurrence of short circuit between the electrodes is high.

1.4. Method for Producing Oscillator

FIGS. 3 to 8 are each a schematic cross-sectional view showing each step of a method for producing an oscillator of this embodiment. The method for producing an oscillator according to this embodiment includes: (a) forming a first layer 20a on a substrate 10; (b) ion implanting a first impurity into a first region of the first layer 20a; (c) forming a first electrode 20 having a tapered plane 23 on a side surface thereof by patterning the first layer 20a; (d) forming a sacrificial layer 25 on the first electrode 20 and on the tapered plane 23 of the first electrode 20; (e) forming a second electrode 30 on the substrate 10 and the sacrificial layer 25 so that the second electrode is disposed to face at least a part of the upper surface of the first electrode 20 and the tapered plane 23 of the first electrode 20; and (f) removing the sacrificial layer 25, wherein the step (b) is performed so that the concentration of the first impurity monotonically decreases from the upper surface side to the lower surface side in a region located at a depth of more than 10 nm from the upper surface of the first electrode 20.

Hereinafter, the steps of the method for producing an oscillator of this embodiment will be sequentially described.

Figure 3:
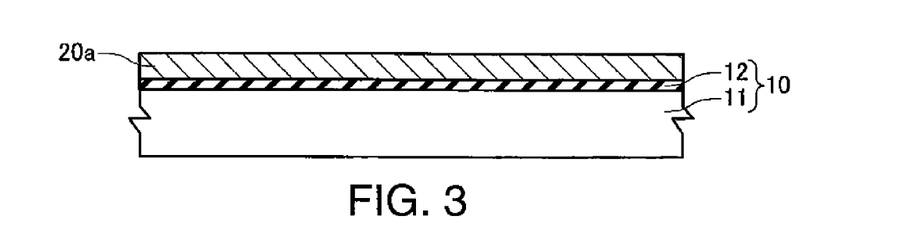
FIG. 3 is a schematic cross-sectional view showing one step of a method for producing an oscillator according to an embodiment.

First, a substrate 10 is prepared by forming an underlayer 12 on a silicon substrate 11. The underlayer 12 is composed of, for example, silicon nitride, and can be formed by a CVD method or a sputtering method. Further, the underlayer 12 may be patterned as needed.

Subsequently, as shown in FIG. 3, a first layer 20a (in this embodiment, a polycrystalline silicon film is used) serving as a first electrode 20 is formed. The first layer 20a can be formed by, for example, a CVD method, a sputtering method, or the like.

Figure 4:
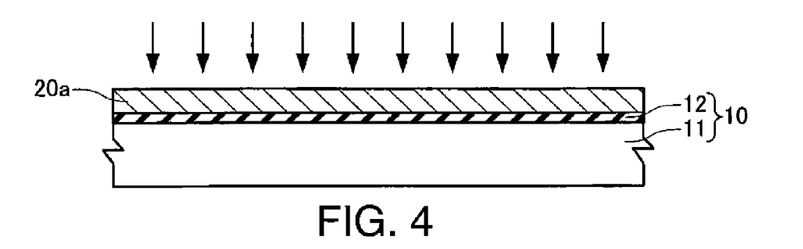
FIG. 4 is a schematic cross-sectional view showing one step of the method for producing an oscillator according to the embodiment.

Subsequently, as shown in FIG. 4, in a first region of the first layer 20a, a first impurity is ion implanted (the arrows in the drawing conceptually show ion implantation). This step can be carried out by a widely used ion implantation method. The first region of the first layer 20a may be the entire first layer 20a in plan view or a part thereof as long as it is set in a region including a portion where a desired etching rate is obtained. In the example shown in the drawing, the first region is set to be the entire surface of the first layer 20a. Further, as the first impurity, arsenic (As), phosphorus (P), boron (B), or the like can be used. By this step, the electrical conductivity can be given to the first layer 20a (polycrystalline silicon), and the distribution of the concentration of the first impurity in the thickness direction of the first layer 20a can be formed. The ion implantation in this step may be performed a plurality of times. Further, the conductivity types of impurities to be used for the ion implantation performed a plurality of times may be the same or different. Further, the conductivity type of the first impurity may be n-type.

In this step, the ion implantation is performed so that the concentration of the first impurity monotonically decreases from the upper surface side to the lower surface side in a region located at a depth of more than 10 nm from the upper surface of the first layer 20a. Also in the case where the ion implantation is performed a plurality of times (for example, in the case where a first impurity and a second impurity are ion implanted), the ion implantation is performed so that the combined concentration of the first impurity and the second impurity monotonically decreases from the upper surface side to the lower surface side in a region located at a depth of more than 10 nm from the upper surface of the first layer 20a. After this step, before the step of forming the first electrode 20 by patterning the first layer 20a, a heat treatment step may be included as needed. In this case, the condition for the ion implantation in this step and the condition for the heat treatment may be adjusted so that after performing the heat treatment step, the concentration of the impurity monotonically decreases from the upper surface side to the lower surface side in a region located at a depth of more than 10 nm from the upper surface of the first layer 20a. In the case where the ion implantation is performed a plurality of times (for example, in the case where a first impurity and a second impurity are ion implanted), the heat treatment step may be performed between the step of ion implanting the first impurity and the step of ion implanting the second impurity. In this case, the condition for the ion implantation in this step and the condition for the heat treatment may be adjusted so that after the second impurity is ion implanted, the combined concentration of the first impurity and the second impurity monotonically decreases from the upper surface side to the lower surface side in a region located at a depth of more than 10 nm from the upper surface of the first layer 20a.

Figure 5:
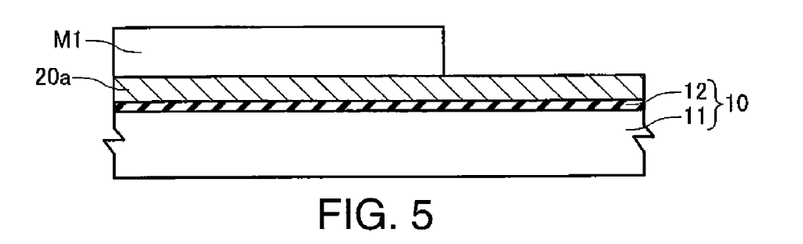
FIG. 5 is a schematic cross-sectional view showing one step of the method for producing an oscillator according to the embodiment.
Figure 6:
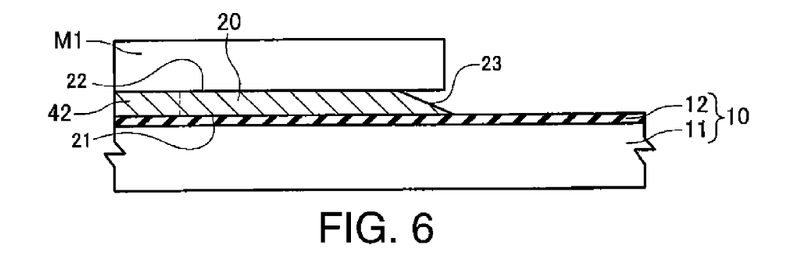
FIG. 6 is a schematic cross-sectional view showing one step of the method for producing an oscillator according to the embodiment.

Subsequently, as shown in FIGS. 5 and 6, the first electrode 20 is formed by patterning the first layer 20a. That is, as shown in FIG. 5, a mask M1 (for example, a resist pattern) is formed by a photolithographic technique, and then, as shown in FIG. 6, the first layer 20a is etched by using the mask M1 as a mask, whereby the first electrode 20 is formed. The etching may be allowed to proceed on the lower surface side of the mask M1. In the example shown in the drawings, a wiring 42 is simultaneously formed in this step. By the etching, a tapered plane 23 of the first electrode 20 is formed.

The etching in this step can be performed by at least either dry etching or wet etching. In this step, since the concentration of the first impurity monotonically decreases from the upper surface side to the lower surface side in a region located at a depth of more than 10 nm from the upper surface of the first layer 20a, an angular portion is hardly formed on the tapered plane 23 of the first electrode 20 and in the vicinity of a connection part between the tapered plane 23 and the second plane 22 of the first electrode 20. Such a characteristic is particularly prominent when dry etching is adopted in this step. The angular portion will be described in detail in "3. Experimental Examples".

Figure 7:
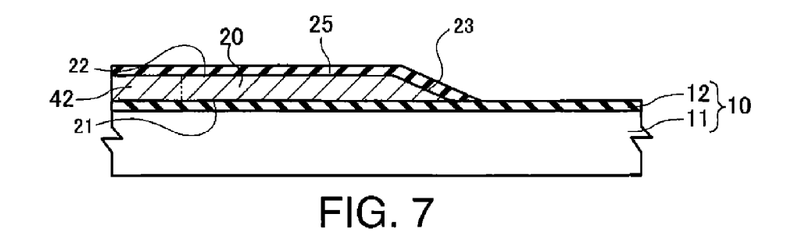
FIG. 7 is a schematic cross-sectional view showing one step of the method for producing an oscillator according to the embodiment.

Subsequently, as shown in FIG. 7, a sacrificial layer 25 is formed on the first electrode 20. In this embodiment, the sacrificial layer 25 is formed by thermally oxidizing the polycrystalline silicon of the first electrode 20. The thermal oxidation treatment can be performed, for example, at a temperature of 800° C. or higher and 1100° C. or lower.

Figure 8:
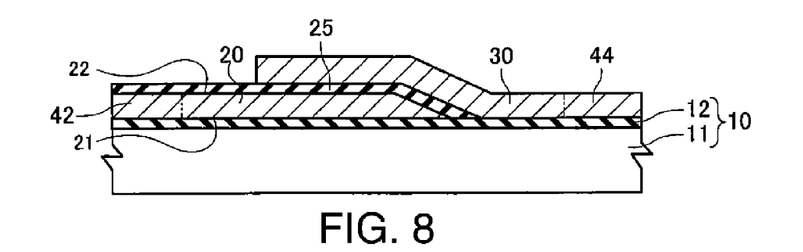
FIG. 8 is a schematic cross-sectional view showing one step of the method for producing an oscillator according to the embodiment.

Subsequently, as shown in FIG. 8, a second electrode 30 is formed on the substrate 10 and the sacrificial layer 25. The second electrode 30 can be formed by, for example, depositing a layer made of a desired material using a CVD method, a sputtering method, or the like, and thereafter patterning the layer using a photolithographic technique and an etching technique. In the example shown in the drawings, a wiring 44 is simultaneously formed in this step.

Then, the sacrificial layer 25 is removed. The sacrificial layer 25 can be removed by, for example, wet etching using hydrofluoric acid, buffered HF (a mixed solution containing hydrofluoric acid and ammonium fluoride), or the like, dry etching using a gas such as hydrogen fluoride, or the like.

As described above, the oscillator 100 shown in FIG. 1 can be produced.

According to the method for producing an oscillator of this embodiment, an angular portion is hardly formed on the first electrode 20, and therefore, a groove is hardly formed on the facing plane 31 of the second electrode 30 facing the first electrode 20. Due to this, a highly reliable oscillator, in which the damage to the second electrode 30 which is deformed by an electrostatic force between the first electrode 20 and the second electrode 30 is suppressed, and also the occurrence of short circuit between the electrodes is suppressed can be produced. Further, according to the method for producing an oscillator of this embodiment, even in the case where the shape of the first electrode 20 is reflected in the shape of the second electrode 30 through the sacrificial layer 25, a highly reliable oscillator can be produced.

2. Electronic Device 2.1. Electronic Device

Figure 9:
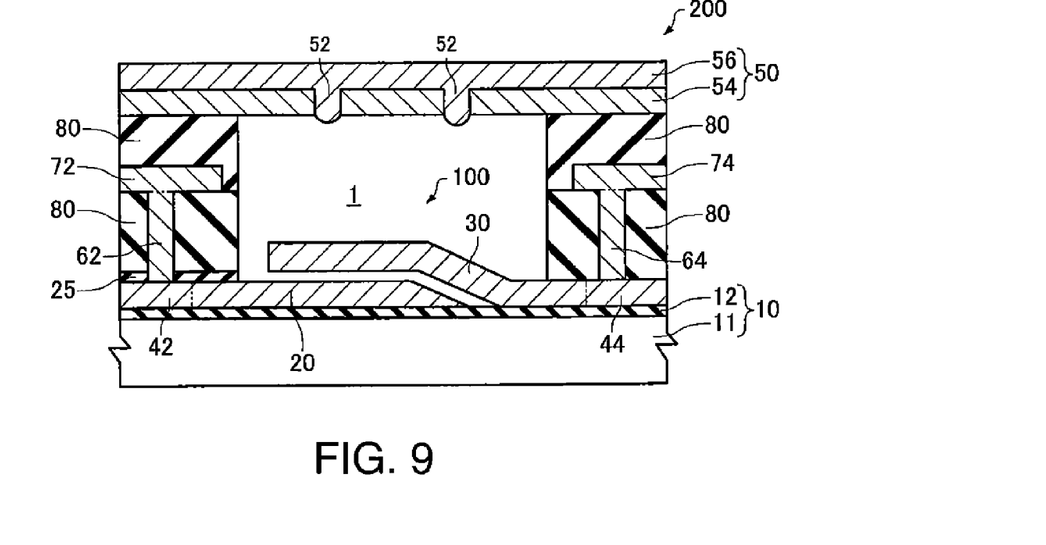
FIG. 9 is a schematic cross-sectional view showing an electronic device according to an embodiment.

An electronic device according to the invention includes the above-described oscillator. Hereinafter, an electronic device 200 including a substrate 10 and the above-described oscillator 100 accommodated in a hollow 1 formed on the substrate 10 will be described.

FIG. 9 is a schematic cross-sectional view showing the electronic device 200. The oscillator 100 included in the electronic device 200 is the same as the above-described oscillator 100, and therefore, the same reference numerals are assigned to the same members, and a detailed description thereof is omitted.

As shown in FIG. 9, the electronic device 200 includes the substrate 10, the hollow 1 formed on the substrate 10, a lid 50 covering the hollow 1, and the oscillator 1 disposed in the hollow 1.

The substrate 10 has an underlayer 12 as shown in the drawing, which functions as an etching stopper layer when the hollow 1 is formed. Between the underlayer 12 and the substrate 10, a trench insulating layer, an LOCOS (Local Oxidation of Silicon) insulating layer, a semi-recess LOCOS insulating layer, or the like (not shown in the drawing) may be formed.

The lid 50 is formed so as to cover the hollow 1. The lid 50 may be composed of one member, but may be composed of a member having a through-hole and a member sealing the through-hole of the member having the through-hole. In the case where the lid 50 is composed of one member, the electronic device 200 may have other structures such as a hole for forming the hollow 1 by, for example, etching, and a sealing member. In the example shown in the drawing, the lid 50 is composed of a first sealing layer 54 having a through-hole 52 and a second sealing layer 56 laminated on the first sealing layer 54 and sealing the through-hole 52.

The first sealing layer 54 has the through-hole 52. The number of the through-holes 52 is not limited. The first sealing layer 54 can be configured to have a single layer structure, but may be configured to have, for example, a laminate structure of three or more layers, in which as the uppermost layer of the laminate structure, a layer composed of at least one substance selected from TiN, Ti, W, Au, and Pt, or an alloy made of these substances is used, and as the lowermost layer of the laminate structure, a layer composed of at least one substance selected from TiN, Ti, W, Au, and Pt, or an alloy of these substances is used, and at least one layer of the laminate structure is formed as an Al—Cu alloy layer.

The second sealing layer 56 is formed on the first sealing layer 54. The second sealing layer 56 can close the through-hole 52 of the first sealing layer 54. The second sealing layer 56 includes, for example, a layer composed of an alloy of one or more substances selected from the group consisting of Al, W, and Cu. The first sealing layer 54 and the second sealing layer 56 can function as the lid 50 which covers the hollow 1 from the above to seal the hollow 1.

The hollow 1 is a space for accommodating the oscillator 100. In the example shown in the drawing, the hollow 1 is defined by the underlayer 12, an interlayer insulating layer 80, and the lid 50. The interior of the hollow 1 can be brought to, for example, a decompressed state, and by doing this, the operational accuracy of the oscillator 100 can be improved.

The oscillator 100 is disposed in the hollow 1. The first electrode 20 and the second electrode 30 are connected to a wiring 42 and a wiring 44, respectively, and further connected to a wiring 72 and a wiring 74 through a via 62 and a via 64 formed in the interlayer insulating layer 80, respectively.

Although not shown in the drawing, the electronic device 200 may also include a circuit portion having a transistor or the like, a terminal for external connection, a pad, an insulating layer such as a passivation layer, or the like. Also, the electronic device 200 may have a WCSP structure.

2.2. Method for Producing Electronic Device

The electronic device of this embodiment can be produced as follows, for example.

A method for producing an electronic device 200 of this embodiment includes the method for producing an oscillator 100 described above. Therefore, a detailed description of the overlapping production steps is omitted. FIGS. 10 to 14 are each a schematic cross-sectional view showing each step of the method for producing an electronic device 200.

The method for producing an electronic device 200 of this embodiment includes: forming an interlayer insulating layer 80 covering an oscillator 100; forming a lid 50 covering the oscillator 100 and the interlayer insulating layer 80; forming a through-hole 52 in the lid 50; and forming a hollow 1 accommodating the oscillator 100 by removing the interlayer insulating layer 80 covering the oscillator 100 and a sacrificial layer 25 by etching through the through-hole 52.

First, in the same manner as the above-described method for producing an oscillator 100, a first electrode 20, a sacrificial layer 25, and a second electrode 30 are formed (see FIG. 8). At this time, the oscillator 100 is not completed, however, the structure shown in FIG. 8 is sometimes referred to as the oscillator 100 in the description of this production method.

Figure 10:
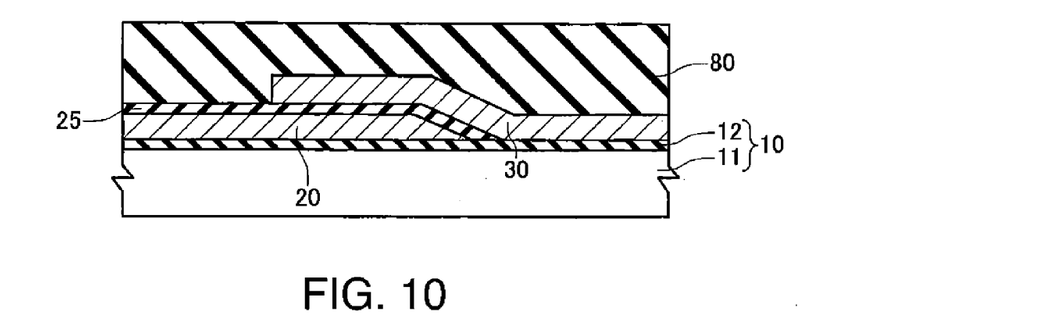
FIG. 10 is a schematic cross-sectional view showing one step of a method for producing an electronic device according to an embodiment.

Subsequently, as shown in FIG. 10, an interlayer insulating layer 80 covering the sacrificial layer 25 and the second electrode 30 is formed. The interlayer insulating layer 80 is formed by, for example, a CVD method, a coating (spin-coating) method, or the like. After forming the interlayer insulating layer 80, a treatment of flattening the surface of the interlayer insulating layer 80 may be performed.

Figure 11:
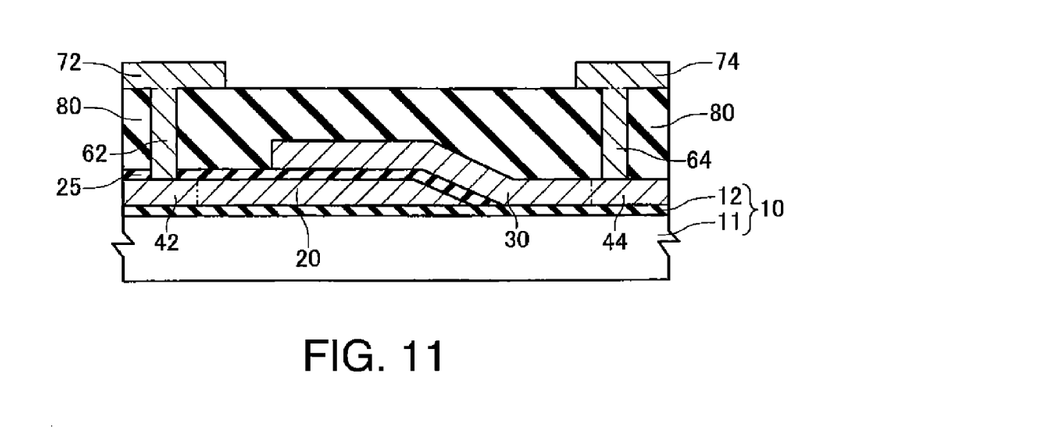
FIG. 11 is a schematic cross-sectional view showing one step of the method for producing an electronic device according to the embodiment.

Subsequently, as shown in FIG. 11, on a wiring 42 and a wiring 44, a via 62 and a via 64 are formed, respectively, and a wiring 72 and a wiring 74 connected thereto are formed. The vias 62 and 64 can be formed by, for example, filling W, Al, or the like. Further, the wirings 72 and 74 can be formed by, for example, sputtering Al, Cu, W, or the like, followed by patterning. In addition, the interlayer insulating layer 80 may be further formed by the same step as described above. At this time, if necessary, a via and a wiring may be further formed. After forming the interlayer insulating layer 80, a treatment of flattening the surface of the interlayer insulating layer 80 may be performed.

Figure 12:
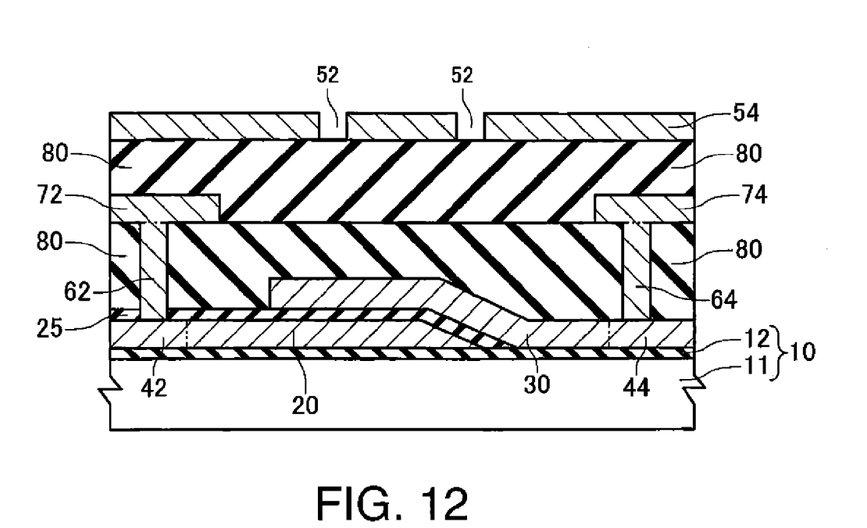
FIG. 12 is a schematic cross-sectional view showing one step of the method for producing an electronic device according to the embodiment.

Subsequently, as shown in FIG. 12, a first sealing layer 54 of a lid 50 is formed. The first sealing layer 54 can be formed by, for example, forming a film through a vapor-phase growth method such as a CVD method or a sputtering method, followed by patterning. Further, by this patterning, as shown in FIG. 12, a through-hole 52 communicating with a hollow 1 is formed.

Figure 13:
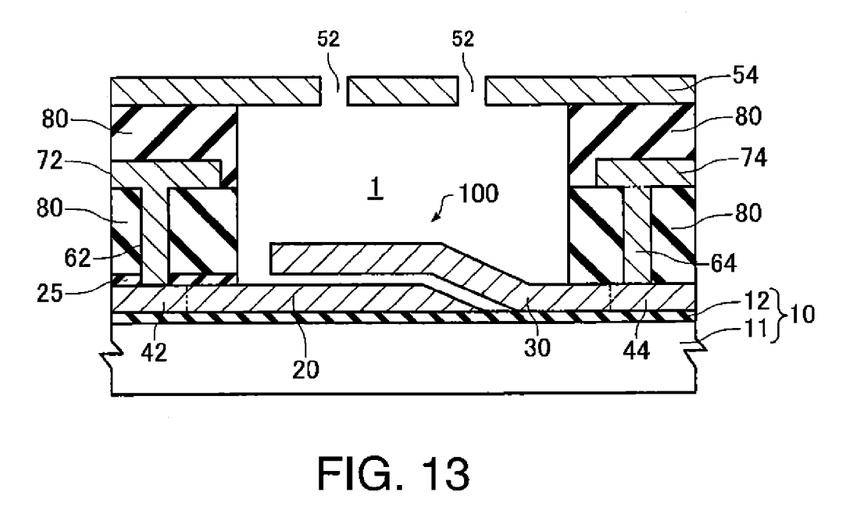
FIG. 13 is a schematic cross-sectional view showing one step of the method for producing an electronic device according to the embodiment.

Subsequently, as shown in FIG. 13, the interlayer insulating layer 80 and the sacrificial layer 25 present in a region to become the hollow 1 are removed by allowing an etching liquid or an etching gas to pass through the through-hole 52, whereby the hollow 1 and the oscillator 100 are formed (in this specification, this step is sometimes referred to as "release step"). The release step can be performed by, for example, wet etching using hydrofluoric acid, buffered HF (a mixed solution containing hydrofluoric acid and ammonium fluoride), or the like, dry etching using a gas such as hydrogen fluoride, or the like. In the release step, a side wall that defines the side surface of the hollow 1 may be used, and in this case, for example, in the above-described step of forming the via 62 and the like, the side wall is formed simultaneously, and the resulting side wall may be used.

Thereafter, the hollow 1 is washed as needed. The washing can be performed with, for example, isopropyl alcohol (IPA) or water.

Then, as shown in FIG. 9, a second sealing layer 56 is formed on the first sealing layer 54. The second sealing layer 56 is formed by, for example, forming a film through a vapor-phase growth method such as a sputtering method or a CVD method, and can seal the through-hole 52. Further, by forming the second sealing layer 56 by a vapor-phase growth method, also the hollow 1 can be sealed while keeping the interior of the hollow 1 in a decompressed state. The lid 50 may be patterned as needed.

By the steps illustrated above, the electron device 200 can be produced.

According to the method for producing an electronic device of this embodiment, an angular portion is hardly formed on the first electrode 20 of the oscillator 100, and therefore, a groove is hardly formed on the plane of the second electrode 30 facing the first electrode 20. Due to this, the electron device 200 including the highly reliable oscillator 100, in which the damage to the second electrode 30 which is deformed by an electrostatic force between the first electrode 20 and the second electrode 30 is suppressed, and also the occurrence of short circuit between the electrodes is suppressed can be produced.

3. EXPERIMENTAL EXAMPLES

Hereinafter, the present invention will be described in further detail by showing experimental examples, however, the invention is by no means limited to the following experimental examples.

3.1. Experimental Method

A plurality of samples in which a polycrystalline silicon film was formed by a CVD method on a silicon substrate having an underlayer ($Si_3N_4$) formed thereon were prepared. The thickness of the polycrystalline silicon film at this time was 280 nm in each sample.

Phosphorus (P) was implanted as an impurity into the entire surface of the polycrystalline silicon film. As for the conditions for the ion implantation and the heat treatment, the following five different types of conditions were employed for each sample.

Experimental Example 1 ion implantation (acceleration voltage: 35 keV, dose: 6E15 atoms/cm$^2$)

Experimental Example 2 ion implantation (acceleration voltage: 35 keV, dose: 6E15 atoms/cm$^2$), followed by ion implantation (acceleration voltage: 5 keV, dose: 6E15 atoms/cm$^2$)

Experimental Example 3 ion implantation (acceleration voltage: 5 keV, dose: 6E15 atoms/cm$^2$)

Experimental Example 4 ion implantation (acceleration voltage: 35 keV, dose: 6E15 atoms/cm$^2$), followed by heat treatment (650° C., 20 minutes, in nitrogen atmosphere)

Experimental Example 5 ion implantation (acceleration voltage: 35 keV, dose: 6E15 atoms/cm$^2$), followed by heat treatment (650° C., 20 minutes, in nitrogen atmosphere), and further followed by ion implantation (acceleration voltage: 5 keV, dose: 6E15 atoms/cm$^2$)

Figure 14:
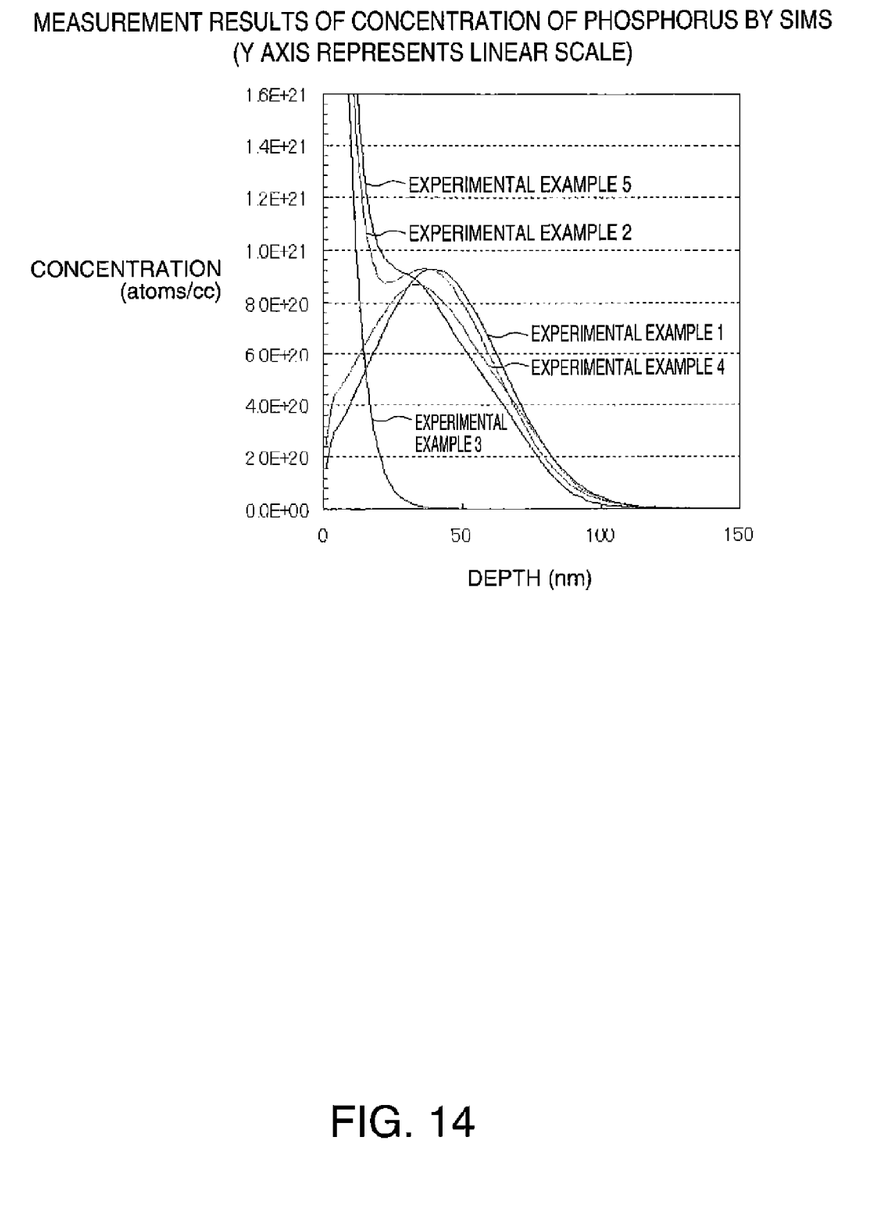
FIG. 14 is a graph showing the SIMS measurement results of experimental examples.

The surface of each sample was measured by SIMS, and the phosphorus concentration distribution in the thickness direction was determined. The results are shown in FIG. 14. The measurement by SIMS was performed under the condition that the surface was irradiated with 5 keV Cs as a primary ion.

Thereafter, on each sample, a mask pattern was formed, followed by dry etching. Then, the mask was removed, a protective film for cross-sectional observation was formed on the polycrystalline silicon film, whereby a sample of each experimental example was obtained.

Each of the obtained samples was cut and the cut surface was observed by a scanning electron microscope (SEM). The results are shown in FIG. 15.

3.2. Experimental Results

Figure 15:
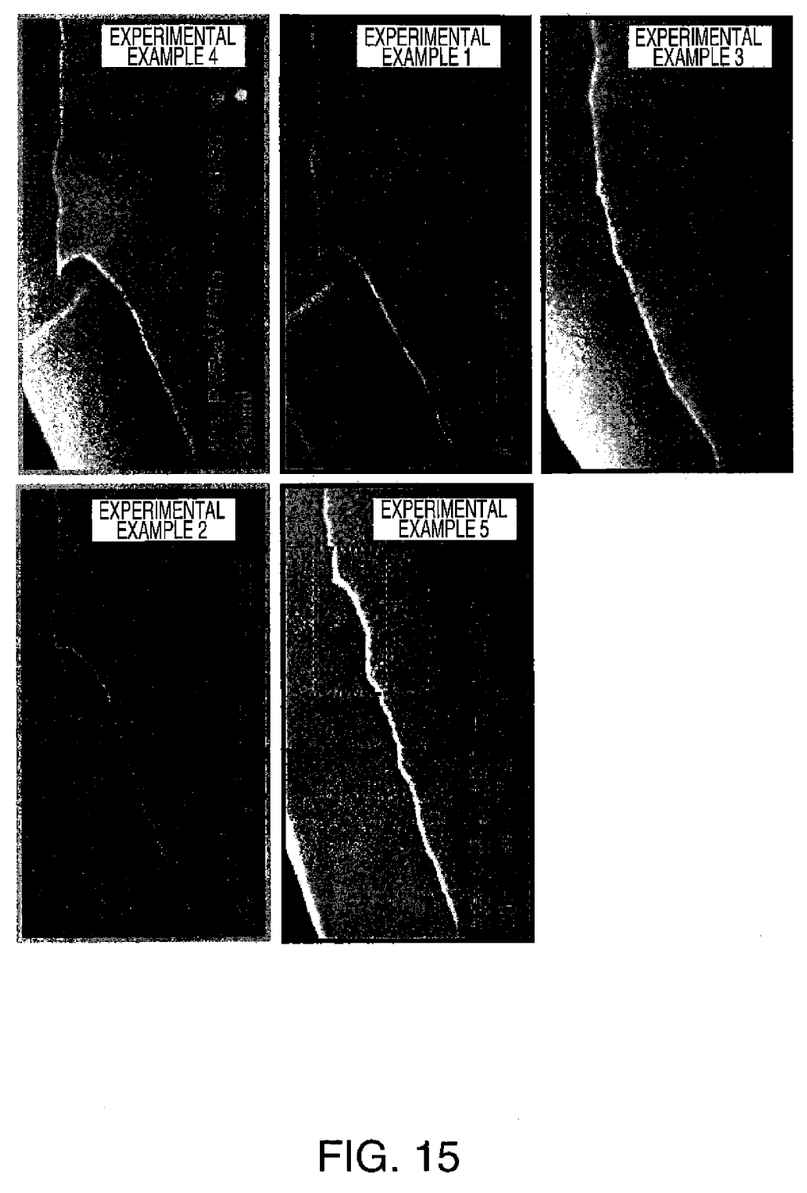
FIG. 15 is a graph showing the SEM observation results of experimental examples.

As is shown in FIGS. 14 and 15, it was found that there is a very good correlation between the concentration profile obtained by SIMS and the shape of the edge of the polycrystalline silicon film obtained from the SEM observation. The SEM images in FIG. 15 are shown in such a manner that the right side is the substrate side.

In the concentration profile obtained by SIMS shown in FIG. 14, in the case of the samples of the experimental examples 1, 2, and 4, there was a local maximum point in a region located at a depth of 40 to 50 nm from the surface. In the SEM images shown in FIG. 15 corresponding thereto, in the case of the samples of the experimental examples 1, 2, and 4, an angular portion protruding toward the surface side of the sample was observed. On the other hand, in the case of the samples of experimental examples 3 and 5, in the concentration profile obtained by SIMS, the concentration of phosphorus monotonically decreased in a region located at a depth of more than 10 nm from the surface without having a local maximum, and a marked angular portion was not observed in the SEM images corresponding thereto. Further, although not shown in the drawing, in the concentration profiles obtained by SIMS of the samples of the experimental examples 2, 3, and 5, a peak was observed in a region located at a depth of about 5 nm from the surface.

From these results, it was found that in the case where the impurity concentration monotonically decreases from the upper surface side to the lower surface side in a region located at a depth of more than 10 nm from the upper surface of the polycrystalline silicon film, even if there is a maximum or a local maximum in the concentration profile in a region located at a depth of less than 10 nm from the upper surface, an angular portion is not observed.

Accordingly, it will be understood that in the case where an additional layer is laminated on the polycrystalline silicon film of the experimental example 3 or 5, a groove (dent) is hardly formed on a plane of the additional layer facing the polycrystalline silicon film.

Note that in the invention, when it is described that a specific member B is disposed (or formed) on (or under) a specific member A, it is not limited to an embodiment in which the member B is disposed (or formed) directly on (or under) the member A, but includes an embodiment in which the member B is disposed (or formed) directly on (or under) the member A through another member within the scope in which the operational effect of the invention is not deteriorated.

The invention is not limited to the embodiments described above, and various modifications are possible. For example, the invention includes essentially the same configurations as the configurations described in the embodiments (for example, a configuration in which the functions, methods, and results are the same, or a configuration in which the objects and the effects are the same). Further, the invention also includes configurations in which non-essential portions of the configurations described in the embodiments are substituted. Further, the invention includes configurations demonstrating the same operational effects or configurations achieving the same objects as the configurations described in the embodiments. Further, the invention includes configurations in which known technologies are added to the configurations described in the embodiments.

What is claimed is:

1. A method for producing an oscillator, comprising:
    (a) forming a first layer on a substrate;
    (b) ion implanting a first impurity into a first region of the first layer;
    (c) forming a first electrode having a tapered plane on a side surface thereof by patterning the first layer;
    (d) forming a sacrificial layer on the first electrode and on the tapered plane of the first electrode;
    (e) forming a second electrode on the substrate and the sacrificial layer so that the second electrode is disposed to face at least a part of the upper surface of the first electrode and the tapered plane of the first electrode; and
    (f) removing the sacrificial layer, wherein
    the step (b) is performed so that the concentration of the first impurity monotonically decreases from the upper surface side to the lower surface side in a region located at a depth of more than 10 nm from the upper surface of the first electrode.

2. The method for producing an oscillator according to claim 1, further comprising (g) ion implanting a second impurity into a second region of the first layer between the step (a) and the step (b), or between the step (b) and the step (c), wherein
    the step (g) is performed so that the second region is located closer to the substrate than the first region, at least a part of the second region overlaps with the first region, and the combined concentration of the first impurity and the second impurity monotonically decreases from the upper surface side to the lower surface side in a region located at a depth of more than 10 nm from the upper surface of the first electrode.

3. The method for producing an oscillator according to claim 1, further comprising, between the step (a) and the step (b), or between the step (b) and the step (c): (g) ion implanting a second impurity into a second region of the first layer; and (h) heating the first layer, wherein the step (g) is performed so that the second region is located closer to the substrate than the first region, the step (h) is performed so that at least a part of the second impurity is diffused in the first region, and the step (g) and the step (h) are performed so that the combined concentration of the first impurity and the second impurity monotonically decreases from the upper surface side to the lower surface side in a region located at a depth of more than 10 nm from the upper surface of the first electrode.

4. The method for producing an oscillator according to claim 1, wherein the first impurity and the second impurity have the same conductivity type.

5. The method for producing an oscillator according to claim 1, wherein the first layer is composed of a semiconductor layer, and in the step of forming the sacrificial layer, the semiconductor layer is formed by thermal oxidation.

6. The method for producing an oscillator according to claim 5, wherein the first layer is composed of a polycrystalline silicon layer.

7. The method for producing an oscillator according to claim 1, wherein the step of patterning the first layer includes:

forming a resist pattern on the first layer; and etching the first layer by using the resist pattern as a mask, and in the etching step, etching is allowed to proceed on the lower surface side of the resist pattern.

* * * * *